(12) United States Patent
Chu et al.

(10) Patent No.: US 6,476,504 B1
(45) Date of Patent: Nov. 5, 2002

(54) ADHESIVE PATTERN FOR ATTACHING SEMICONDUCTOR CHIP ONTO SUBSTRATE

(75) Inventors: Fu Tang Chu; Ji Ping Teng, both of Fengshan (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 0 days.

(21) Appl. No.: 09/993,772

(22) Filed: Nov. 27, 2001

(51) Int. Cl.⁷ .............................................. H01L 23/48
(52) U.S. Cl. ........................ 257/783; 257/773; 257/783; 156/295; 156/291
(58) Field of Search ................................ 257/773, 783, 257/786; 156/291, 295

(56) References Cited

U.S. PATENT DOCUMENTS 5,423,889 A * 6/1995 Colquitt et al. ............ 29/25.01
5,681,757 A   10/1997 Hayes
6,174,406 B1 * 1/2001 Gaynes et al. .............. 156/295

OTHER PUBLICATIONS

Onodera et al., US Patent Publication 2001/0013641, Aug. 16, 2001.*

* cited by examiner

Primary Examiner—David L. Talbott
Assistant Examiner—David A. Zarneke
(74) Attorney, Agent, or Firm—Dykema Gossett PLLC (57) ABSTRACT

An adhesive pattern for attaching a semiconductor chip onto a non-uniform substrate is disclosed. The adhesive pattern comprises a double-k pattern formed on the substrate. The double-k pattern includes a longest major line and four shorter lines connected to the major line. The non-uniform substrate has a conductive circuit and a solder mask formed on the substrate including the circuit. The substrate has a die covering region for receiving the semiconductor chip. The conductive circuit of the substrate comprises a plurality of conductive traces unequally distributed on the die covering region. The double-k adhesive pattern of the present invention is applied onto the non-uniform substrate by a dispenser in a manner that the area on the substrate defined between the major line and the border of the die covering region has a trace density lower than the other area on the substrate.

2 Claims, 8 Drawing Sheets

ADHESIVE PATTERN FOR ATTACHING SEMICONDUCTOR CHIP ONTO SUBSTRATE

BACKGROUND OF THE INVENTION

1. Field of the Invention

This invention generally relates to a die attach method of an assembly process of semiconductor packages, and more particularly to an adhesive pattern for use in the die attach method.

2. Description of the Related Art

Generally, an assembly process of semiconductor packages includes: dicing of a wafer including a number of semiconductor chips into individual semiconductor chips; attaching each semiconductor chip onto means for supporting chips, i.e., a substrate or a lead frame using an adhesive; electrically connecting each semiconductor chip to the supporting means; encapsulating each chip against a portion of the supporting means.

In the die attach process, the substrate or the lead frame is placed at a predetermined position by a transferring unit, and an adhesive is applied to the metal paddle of the substrate or the die pad of the lead frame by a dispenser in the die-bonding equipment. Then, an automatic pick and place machine picks up a semiconductor chip and accurately places the chip to the metal paddle or the die pad with the pre-dispensed adhesive. The final step of the die-bonding process is curing of the adhesive.

Traditionally, the epoxy is dispensed on the metal paddle of the substrate or the die pad or the lead frame in a predetermined dot or line pattern. Typically, both of the metal paddle and the die pad have a uniform surface. Therefore, conventional adhesive patterns can adequately attach the chip to the die pad or the lead frame without causing voids or the problem of adhesive bleed.

However, when the conventional adhesive patterns are used for overlaying the surface of a non-uniform substrate, voids are often unavoidable. When the voids are generated in the adhesive, moisture from the environment easily penetrates into the adhesive and accumulates in the voids. Once moisture accumulates in the voids, rapid temperature ramp-up, e.g., in the curing process, will cause the moisture to vaporize and expand, thereby inducing hydrothermal stresses in the area around the voids. Furthermore, when a semiconductor chip is mounted to the uneven surface applied with the conventional adhesive patterns, the adhesive tends to bleed out of the die perimeter thereby contaminating chip connection pads disposed nearby, which is fatal to surface bondability thereof.

Therefore, a need exists in the semiconductor industry for an adhesive pattern suitable for a non-uniform substrate which overcomes, or at least reduces the above-mentioned problems of the prior art.

SUMMARY OF THE INVENTION

It is a primary object of the present invention to provide an adhesive pattern suitable for a non-uniform substrate which avoids void formation in the adhesive while preventing the adhesive bleed.

It is another object of the present invention to provide a die attach method utilizing a double-k adhesive pattern which avoids void formation in the adhesive while preventing the adhesive bleed.

In accordance with at least the above objects, the present invention discloses a double-k adhesive pattern for attaching a semiconductor chip onto a non-uniform substrate. The double-k pattern includes a longest major line and four shorter lines connected to the major line. The non-uniform substrate has a conductive circuit and a solder mask formed on the substrate including the circuit. The substrate has a die covering region for receiving the semiconductor chip. The conductive circuit of the substrate comprises a plurality of conductive traces unequally distributed on the die covering region. The double-k adhesive pattern of the present invention is applied onto the non-uniform substrate by a dispenser of a die-bonding equipment in a manner that the area on the substrate defined between the major line and the border of the die covering region has a trace density lower than the other area on the substrate.

The present invention further provides a die attach method comprising: (a) providing a substrate including a conductive circuit and a solder mask formed over the substrate including the circuit with a substantially uniform thickness wherein areas on the conductive circuit adapted for electrical connection are exposed from the solder mask, the substrate having a die covering region for receiving a semiconductor chip, the conductive circuit having at least a portion formed on the die covering region with an unequally distributed layout pattern; (b) forming an adhesive on the substrate in a double-k pattern; (c) placing the semiconductor chip onto the adhesive; and (d) curing the adhesive.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

As to the problems occurred in attaching a semiconductor chip to a non-uniform substrate via conventional adhesive patterns as described in the above prior patterns of FIGS. 1 to 6, it has been found that if a double-k adhesive pattern can be utilized as the dispensing pattern in the die attach process, occurrence of void formation and adhesive bleed are greatly suppressed. As used in the present invention, the word "non-uniform substrate" means "substrate with a plurality of conductive traces unequally distributed on a die covering region of the substrate."

Figure 4:
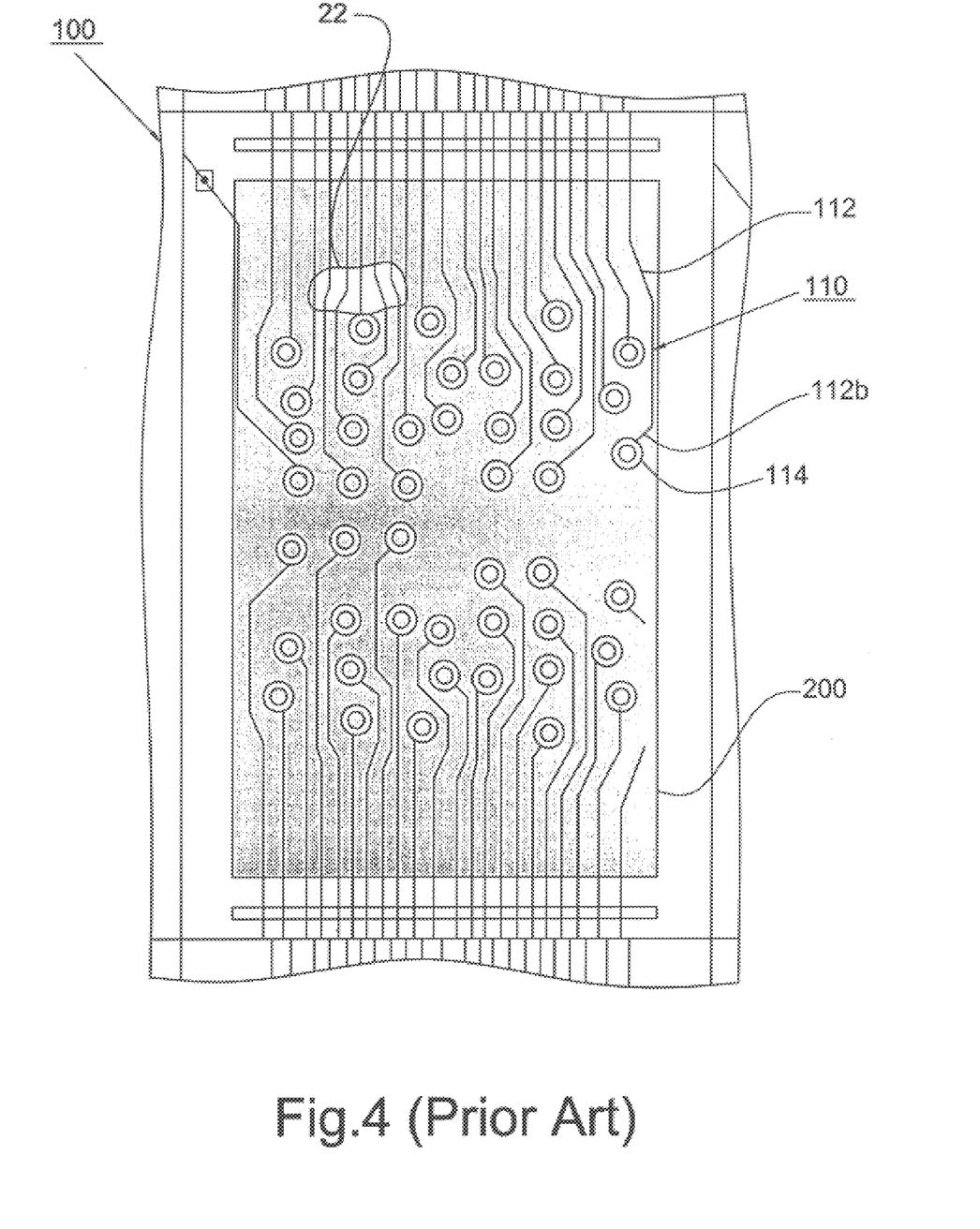
FIG. 4 is a schematic plan view showing a chip on the substrate of FIG. 3 according to an X-ray analysis after performing the die-attach process according to the prior art.
Figure 5:
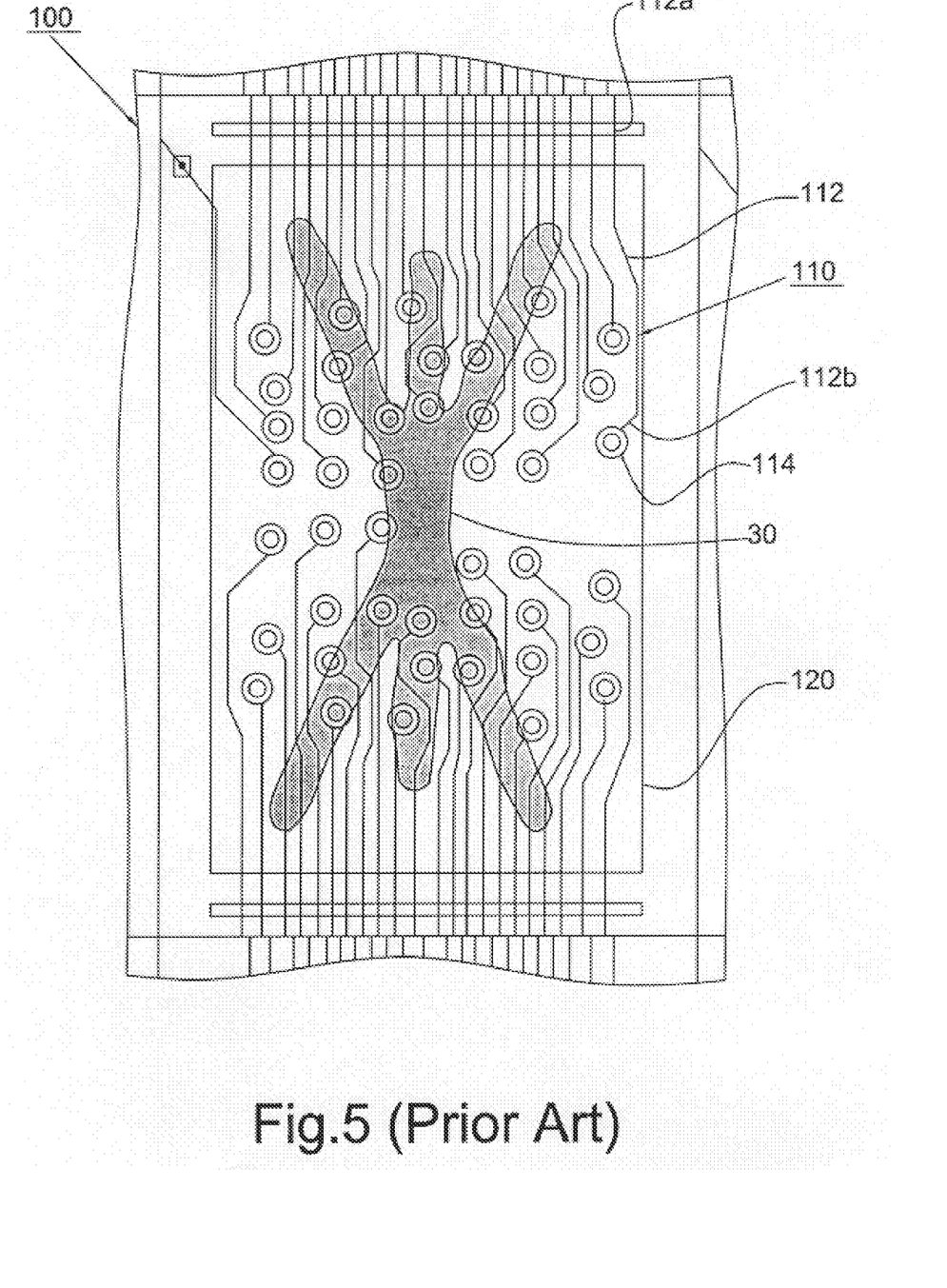
FIG. 5 is a top plan view of an asterisk adhesive pattern formed on a substrate according to the prior art.

First, an adhesive is applied to a non-uniform substrate such as a thin fine-pitch ball grid array (TFBGA) substrate 100 in a pattern of a snow-stat 10 (see FIG. 1), double Y 20 (see FIG. 3) or asterisk 30 (see FIG. 5). Then, a chip 200 is placed onto the substrate 100 with the pre-dispensed adhesive. Finally, the substrate with the chip attached thereon is subjected to an X-ray inspection, and the results are shown in FIG. 2, FIG. 4 and FIG. 6, respectively.

Figure 1:
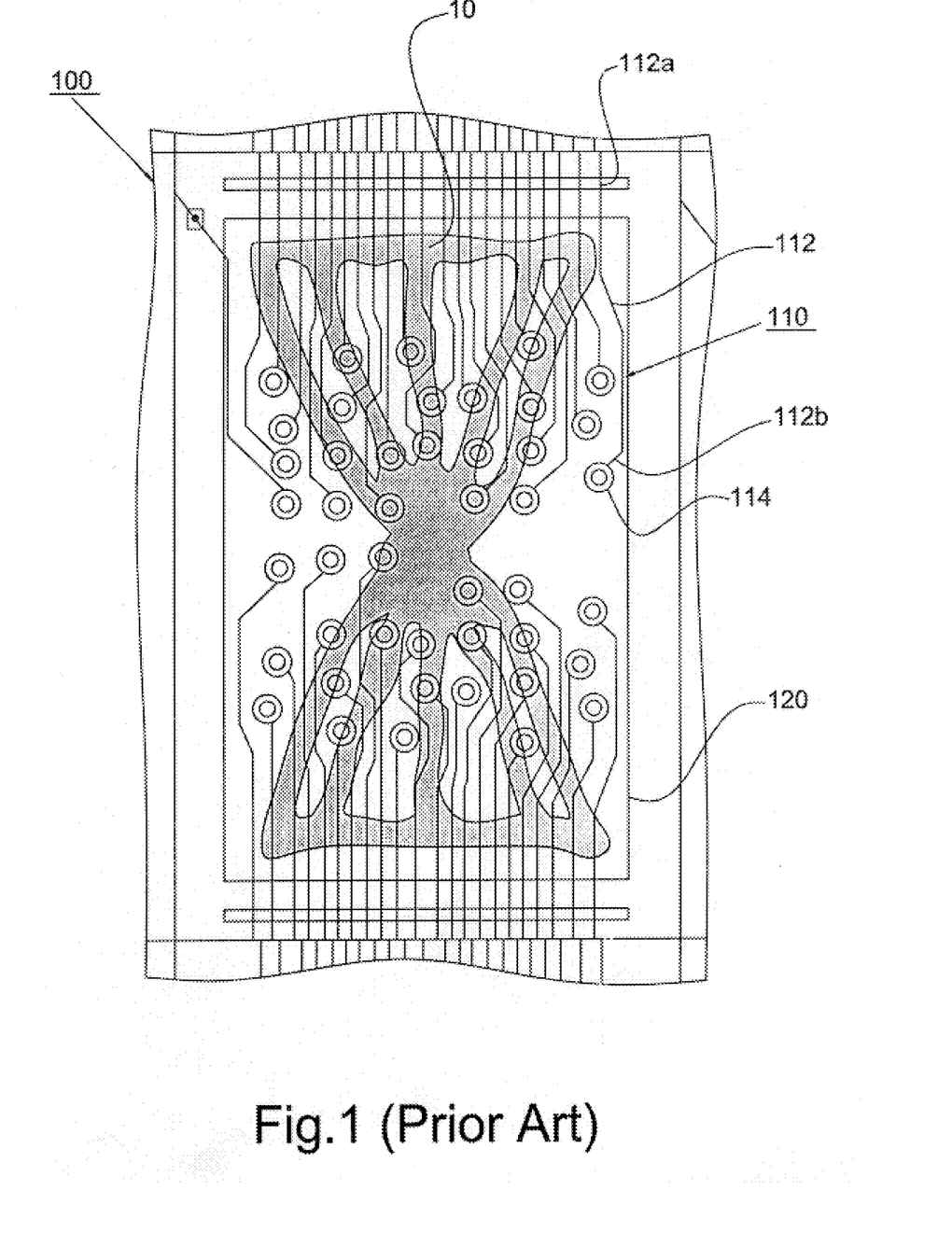
FIG. 1 is a top plan view of a snow-star adhesive pattern formed on a substrate according to the prior art.
Figure 2:
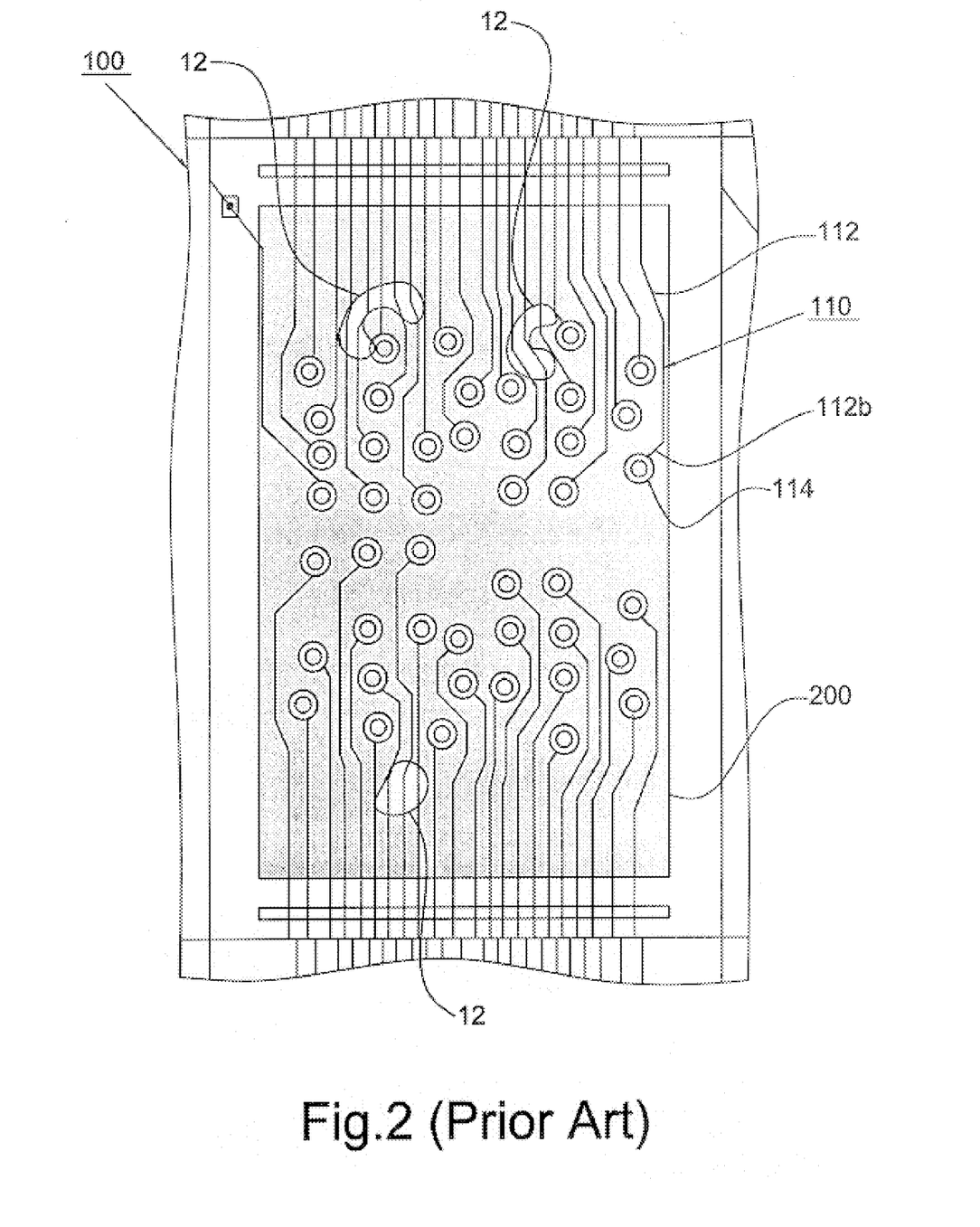
FIG. 2 is a schematic plan view showing a chip on the substrate of FIG. 1 according to an X-ray analysis after performing the die-attach process according to the prior art.

Referring to FIG. 1 and FIG. 2, when the chip 200 is placed on the adhesive in snow-star pattern overlaid on the TFBGA substrate 100, voids 12 are generated at locations corresponding to the upper side and the lower side of the substrate 100. As shown in FIG. 1, the substrate 100 mainly includes a conductive circuit 110 and a solder mask formed over the substrate including the circuit. It could be understood that the substrate 100 may be one of a plurality of substrates formed in a strip configuration. The substrate 100 has a die covering area 120 for a semiconductor chip to dispose thereon. It should be understood that when a semiconductor chip is mounted to the substrate 100, the die covering area 120 is entirely covered by the chip. It is noted that the conductive circuit 110 has at least a portion formed on the die covering region 120 with an unequally distributed layout pattern. Specifically, the conductive circuit 110 includes a plurality of conductive traces 112 unequally distributed on the die covering region 120. One end 112a of the conductive trace 112 is exposed from the solder mask for electrically connecting to the chip, and the other end 112b of the conductive trace 112 is connected to a plated through hole 114. The lower surface of the substrate 100 is provided with a plurality of solder pads (not shown) electrically connected to corresponding conductive traces 112. The conductive traces 112 and the solder pads are usually made of metal with good electrical conductivity such as copper. Since the solder mask has a substantially uniform thickness, the conductive 112 in the die covering region 120 will make the surface of the substrate 110 uneven. During the die bonding process, since air is easily trapped between the closely-spaced traces, voids are prone to generate at locations corresponding to the upper side and the lower side of the substrate 100 after die placement.

Figure 3:
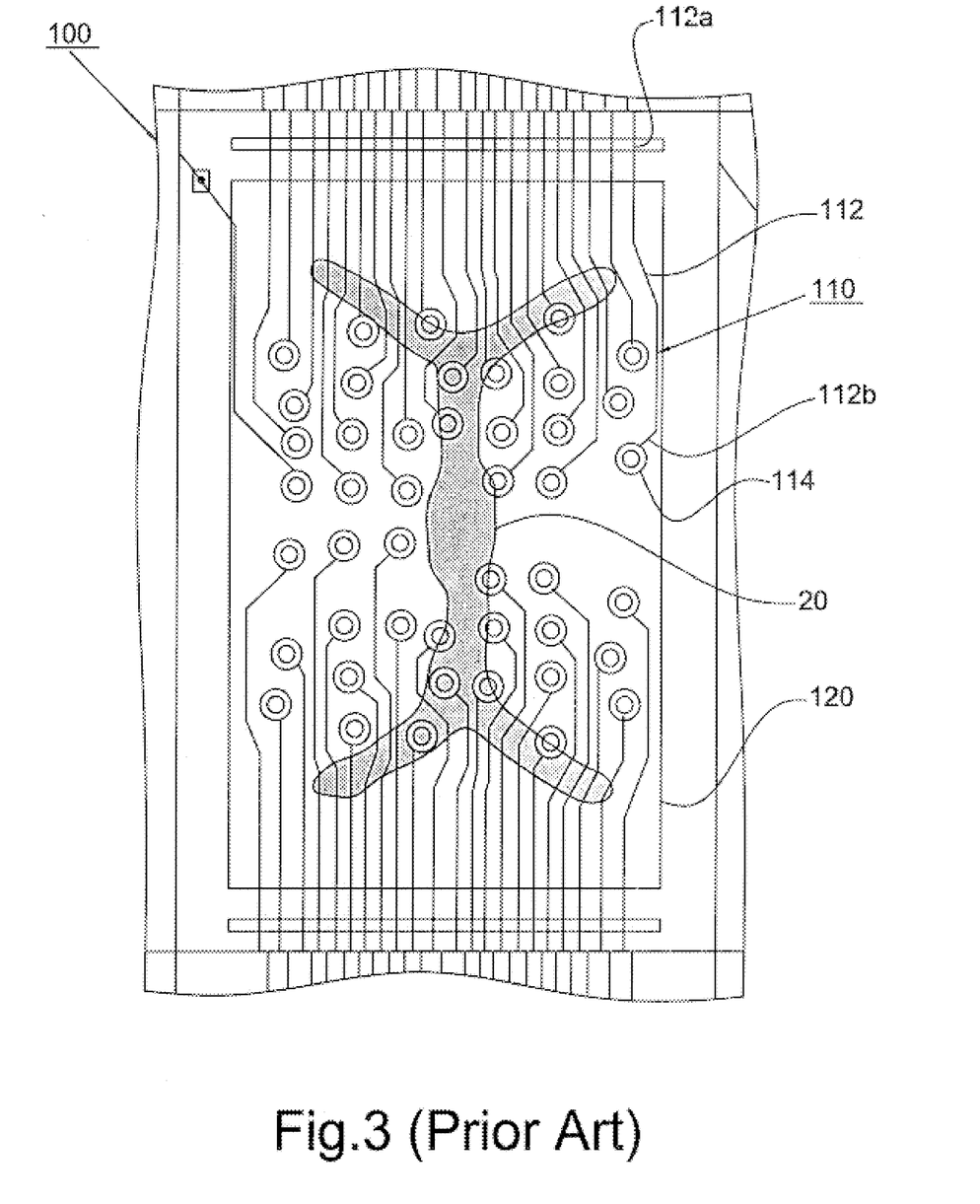
FIG. 3 is a top plan view of a double Y adhesive pattern formed on a substrate according to the prior art.

Referring to FIG. 3 and FIG. 4, when the chip 200 is placed on the adhesive in a double Y pattern overlaid on the TFBGA substrate 100, voids 22 are generated at locations corresponding to the upper side of the substrate 100.

Figure 6:
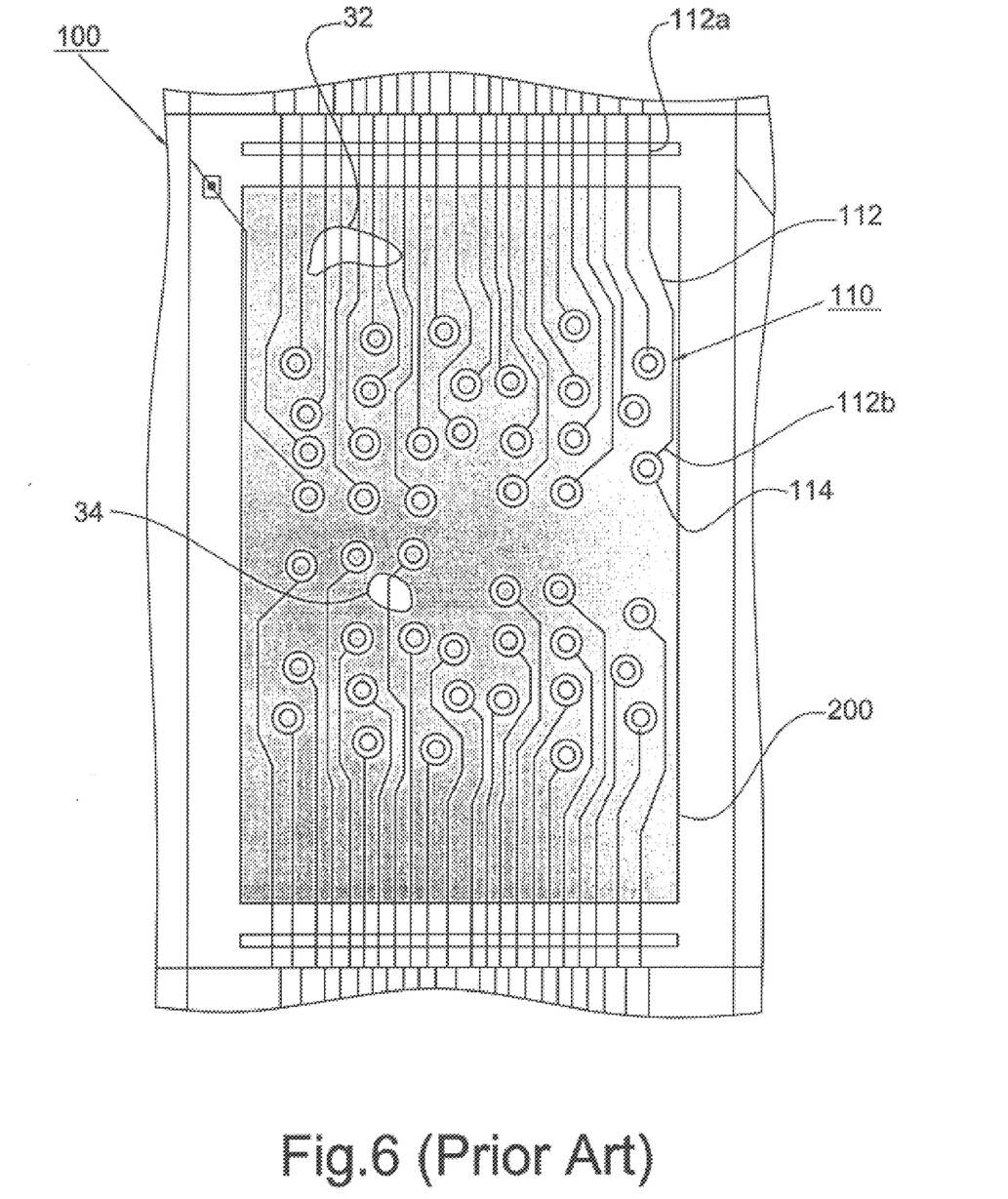
FIG. 6 is a schematic plan view showing a chip on the substrate of FIG. 5 according to an X-ray analysis after performing the die-attach process according to the prior art.

Referring to FIG. 5 and FIG. 6, when the chip 200 is placed on the adhesive in an asterisk pattern overlaid on the TFBGA substrate 100, voids 32 are generated at locations corresponding to the upper side and the middle region of the substrate 100.

Figure 7:
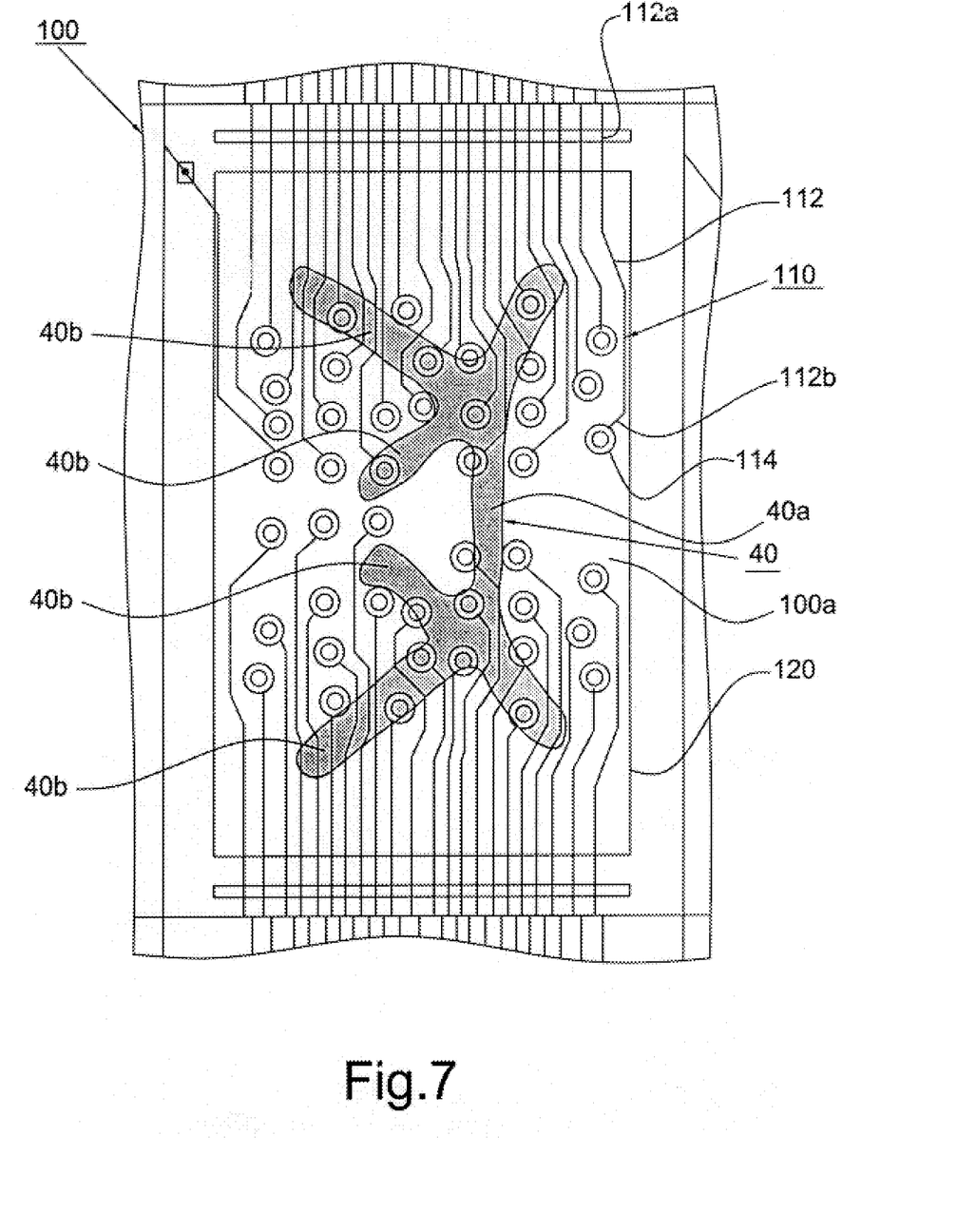
FIG. 7 is a top plan view of a double-k adhesive pattern formed on a substrate accordance with the invention.
Figure 8:
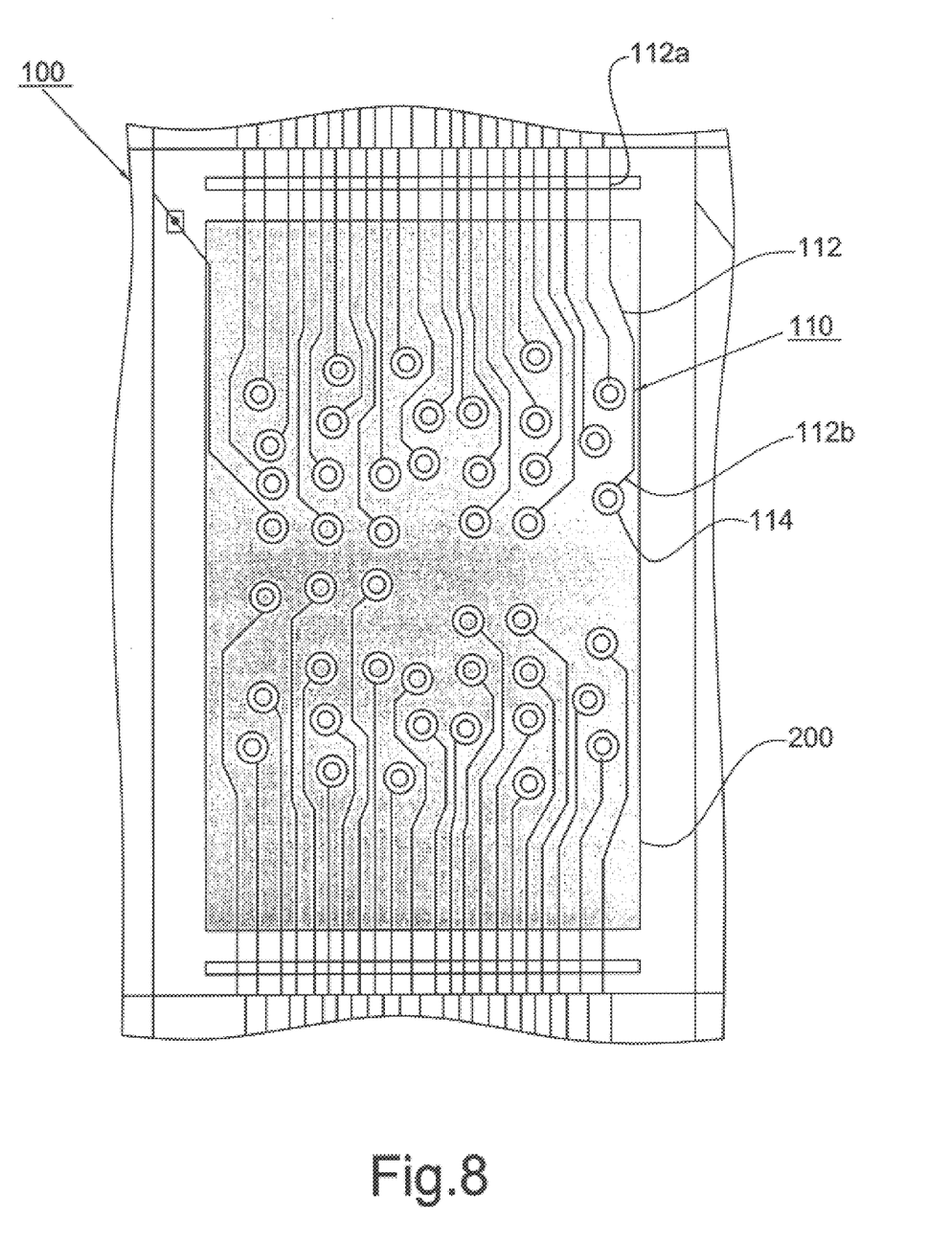
FIG. 8 is a schematic plan view showing a chip on the substrate of FIG. 7 according to an X-ray analysis after performing the die-attach process according to the prior art.

FIG. 7 shows an adhesive as applied to the TFBGA substrate 100 in a double-k pattern 40 of the present invention. The double-k pattern 40 includes a longest major line 40a and four shorter lines 40b connected to the major line. It is noted that the area on the substrate defined between the major line 40a of the double-k pattern 40 and the border of the die covering region 120 has a trace density lower than the other area on the substrate 100. Referring to FIG. 8, after placing the chip 200 on the substrate, the adhesive distributed in the four shorter lines 40b of the double-k pattern 40 is sufficient to fill the gaps between the closely-spaced traces thereby avoiding void formation in the adhesive. Furthermore, after placing the chip 200 on the substrate, the adhesive distributed in the major line 40a of the double-k pattern 40 is sufficient to overlay the area 110a with a lower trace density while the adhesive does not bleed out of the perimeter of the chip 200.

Next, a die attach method utilizing the double-k adhesive pattern of the present invention will be described.

1. A stack of substrates is placed into the loading module of a die bonder. The robotic loader picks up a substrate from the stack and places it onto the substrate handler or indexer.
2. When a semiconductor chip is placed on the double-k adhesive pattern applied on an uneven surface, the adhesive does not bleed out of the perimeter of the chip.
3. At the dispense position, epoxy area on the substrate is aligned using optics and precision sensors. An adhesive is dispensed on the substrate in a double-k pattern. If the substrate contains multiple epoxy areas; adhesive is dispensed on each epoxy area.
4. Once the dispensing has been completed on the entire substrate, it is transported along the indexer to the second process position, which is die bonding.
5. An automatic pick and place module picks up a semiconductor chip and accurately places the chip to the substrate with the pre-dispensed adhesive.
6. Once the substrate goes through the process described above, it is unloaded into an export magazine.
7. Once a magazine is filled with substrates, it is transported from the die bonder to a curing station. Thereafter, the adhesive is cured.

Based on the above description, the present invention is believed to have at least the following advantages:

1. When the double-k adhesive pattern of the present invention is utilized to overlay the surface of a non-uniform substrate, void formation in the adhesive is avoided.
2. When a semiconductor chip is placed on the double-k adhesive pattern applied on an uneven surface, the adhesive do not bleed out of the perimeter of the chip.

Although the present invention is discussed in detail with respect to applying the double-k adhesive pattern to a TFBGA substrate, the present invention is applicable to a wide variety of substrates with a plurality of conductive traces unequally distributed on a die covering region thereof.

Although the invention has been explained in relation to its preferred embodiment, it is to be understood that many other possible modifications and variations can be made without departing from the spirit and scope of the invention as disclosed in the accompanying claims.

What is claimed is:

1. An adhesive pattern for attaching a semiconductor chip onto a substrate with a conductive circuit and a solder mask formed thereon wherein the substrate has a die covering region for receiving the semiconductor chip, the adhesive pattern comprising a double-k pattern formed on the substrate, the double-k pattern including a longest major line and four shorter lines connected to the major line.

2. The adhesive pattern as claimed in claim 1, wherein the conductive circuit of the substrate comprises a plurality of conductive traces unequally distributed on the die covering region such that the area on the substrate defined between the major line and the border of the die covering region has a trace density lower than the other area on the substrate.

* * * * *